United States Patent

Yamamoto et al.

[11] Patent Number: 5,866,918
[45] Date of Patent: Feb. 2, 1999

[54] SEMICONDUCTOR LIGHT EMITTING DEVICE

[75] Inventors: Yousuke Yamamoto; Misao Hironaka, both of Tokyo, Japan

[73] Assignee: Mitsubishi Denki Kabushiki Kaisha, Tokyo, Japan

[21] Appl. No.: 584,199

[22] Filed: Jan. 11, 1996

[30] Foreign Application Priority Data

Feb. 15, 1995 [JP] Japan .................................. 7-026369

[51] Int. Cl.[6] .................................................... H01L 29/06
[52] U.S. Cl. .............................................. 257/13; 372/46
[58] Field of Search .................................. 257/13; 372/46

[56] References Cited

U.S. PATENT DOCUMENTS 5,297,158  3/1994  Naitou et al. .............................. 372/46

FOREIGN PATENT DOCUMENTS 1211989  8/1989  Japan .
1232784  9/1989  Japan .
4186686  7/1992  Japan .

OTHER PUBLICATIONS

Yamashita et al., "High–Power 780 nm AlGaAs Quantum–Well Lasers And Their Reliable Operation", IEEE Journal of Quantum Electronics, vol. 27, No. 6, 1991, pp. 1544–1549.

*Primary Examiner*—Olik Chaudhuri
*Assistant Examiner*—Douglas A. Wille
*Attorney, Agent, or Firm*—Leydig, Voit & Mayer

[57] ABSTRACT

A method of fabricating a semiconductor light emitting device includes forming an SiON film thinner than 50 nm on a stripe region on a surface of a first semiconductor layer at a first temperature, etching the first semiconductor layer using the SiON film as a mask and forming an optical waveguide including the first semiconductor layer which is left below the SiON film, and selectively growing a second semiconductor layer as a current blocking layer where the first semiconductor layer was removed by etching, using the SiON film as a mask at a second temperature. Therefore, adhesion of the material of the current blocking layer to the surface of the selective growth mask is suppressed, and imperfect growth of the contact layer and imperfect contact of the electrode directly formed on the upper surface of the wave-guide are suppressed, respectively. In addition, the generation of dark lines due to stress between the selective growth mask and the semiconductor layer constituting the upper part of the wave-guide is suppressed, and reduction in light output power is prevented.

2 Claims, 7 Drawing Sheets

SEMICONDUCTOR LIGHT EMITTING DEVICE

FIELD OF THE INVENTION

The present invention relates to a method of fabricating a semiconductor light emitting device and a semiconductor light emitting device fabricated by the method and, more particularly, to a method of fabricating a semiconductor laser device in which current blocking layers are selectively grown on both sides of an optical waveguide and to a semiconductor light emitting device fabricated by the method.

BACKGROUND OF THE INVENTION

FIGS. 7(a)–7(d) are sectional views illustrating a method of fabricating a semiconductor laser device according to the prior art. Initially, in the step of FIG. 7(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1, an $SiO_2$ film is formed on the p type GaAs cap layer 5 and then etched away so that the $SiO_2$ film is left only on a striped region of the cap layer 5. Next, using the remaining $SiO_2$ film 70 as a mask, the p type GaAs cap layer 5 and a part of the p type AlGaAs upper cladding layer 4 is etched away, and a portion to be an optical waveguide under the $SiO_2$ film 70 (hereinafter, referred to as optical waveguide region) is left as shown in FIG. 7(b). In the step of FIG. 7(c), n type GaAs current blocking layers 6 are selectively grown so as to bury the etched portion. Next, in the step of FIG. 7(d), after the removal of the $SiO_2$ film 70, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. When a forward bias voltage is applied between the n side and the p side electrodes of the semiconductor laser device fabricated as described above, and a current flowing in the semiconductor laser device is larger than a threshold current of the laser, laser oscillation occurs. At this time, the current flowing into the semiconductor laser device is concentrated in the optical waveguide region by the current blocking layers. Therefore, electrons and holes are effectively injected into the active layer of the optical waveguide region, and then laser oscillation occurs in the active layer of the optical waveguide region due to the recombination of electrons and holes. Also in S. Yamashita et al., "High-Power 780 nm AlGaAs Quantum-Well Lasers and Their Reliable Operation," IEEE Journal of Quantum Electronics, vol.27, pp.1544–1549, June 1991, the fabricating method of the semiconductor laser device as described above is disclosed.

In the prior art method of fabricating the semiconductor laser device, since the selective growth mask for the current blocking layer 6 comprises the $SiO_2$ film containing a large quantity of oxygen, the GaAs of the current blocking layer 6 is partly adhered on the $SiO_2$ film during the selective growth of the current blocking layer 6. In the etching generally used for removing the $SiO_2$ film, GaAs is not etched. For example, though $SiO_2$ is dissolved in a hydrofluoric acid based etchant used for etching $SiO_2$, GaAs is not dissolved in this etchant. Therefore, when the $SiO_2$ film is etched, the $SiO_2$ film directly under the GaAs which is adhered on the $SiO_2$ film is not etched and is left on the surface of the p type GaAs cap layer 5, and so this causes an imperfect growth of the contact layer 7 formed on the cap layer 5. When the imperfect growth of the contact layer 7 occurs, the electrical resistance of the contact layer 7 is increased and light output is lowered.

In addition, in the process for selectively growing the current blocking layer and the process for cooling the layer after the growth, dislocations are produced in the semiconductor layer by a shearing stress between the $SiO_2$ film 70 and the p type GaAs cap layer 5 and penetrates the active layer 3 of the optical waveguide region. Further, by operating this laser device, dislocations propagate in the active layer 3, and the recombination of electrons and holes is non-radiative in the vicinity of the dislocations. Such a non-radiative region in the vicinity of a dislocation is called a dark line. Due to the generation of dark lines, the light output power of the laser device is reduced.

SUMMARY OF THE INVENTION

It is an object of the present invention to provide a method of fabricating a semiconductor light emitting device preventing the material of the current blocking layer from adhering to the surface of the selective growth mask during the selective growth of the current blocking layer and suppressing the generation of dislocations in the active layer, and it is another object to provide a semiconductor light emitting device fabricated by the method.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor light emitting device comprises forming an SiON film having a thickness thinner than 50 nm in a striped region on a surface of a first semiconductor layer at a film formation temperature which is a first temperature, etching the first semiconductor layer to a prescribed depth using the SiON film as a mask and forming an optical waveguide comprising the first semiconductor layer which is left below the SiON film, and selectively growing a second semiconductor layer which is to be a current blocking layer on a portion of the first semiconductor layer removed by etching using the SiON film as a mask at a growth temperature which is a second temperature. Since the selective growth mask for the current blocking layer comprises SiON having a composition ratio of oxygen lower than that of $SiO_2$ in the prior art, the adhesion of the material of the current blocking layer to the surface of the SiON film is suppressed, and the SiON film directly under the material of the current blocking layer adhering on the film is prevented from remaining when the SiON film is removed after the growth of the current blocking layer. Therefore, an imperfect growth of the contact layer which is grown on the optical waveguide after the removal of the SiON film is suppressed, and even when an electrode is directly formed on the waveguide, an imperfect contact of the electrode with the upper surface of the waveguide is prevented. That is, the reduction in the light output power due to the imperfect growth of the contact layer or due to the imperfect contact of the electrode with the upper surface of the waveguide is prevented. In addition, since the thickness of the SiON film as the selective growth mask for the current blocking layer is thinner than 50 nm, a stress such as a shearing stress produced between the selective growth mask and the semiconductor layer constituting the upper part of the waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a second aspect of the present invention, the method of fabricating the semiconductor light emitting device further includes etching away the SiON film and growing a contact layer on the entire surface of the optical waveguide and the current blocking layer after the selective growth of the current blocking layer. Since the selective growth mask for the current blocking layer comprises SiON having a composition ratio of oxygen lower than that of $SiO_2$ in the prior art, the adhesive of the material of the current blocking layer to the surface of the SiON film is suppressed, and the SiON film directly under the material of the current blocking layer adhering on the film is prevented from remaining when the SiON film is etched away after the growth of the current blocking layer. Therefore, an imperfect growth of the contact layer which is grown on the optical waveguide after the removal of the SiON film is suppressed, and the reduction in the light output power is prevented. In addition, since the thickness of the SiON film as the selective growth mask for the current blocking layer is thinner than 50 nm, a stress such as a shearing stress produced between the selective growth mask and the semiconductor layer constituting the upper part of the waveguide by a heat history during the selective growth of the current blocking layer is relaxed, and the generation of dark lines in the active layer due to these dislocations is suppressed, whereby the reduction in the light output power is prevented.

According to a third aspect of the present invention, in the method of fabricating the semiconductor light emitting device, the current blocking layer comprises GaAs, and a selective growth mask for the current blocking layer comprises SiON having a composition ratio of oxygen lower than that of $SiO_2$ in the prior art, so the adhesion of the GaAs as the material of the current blocking layer to the surface of the SiON film is suppressed, and the SiON film directly under the GaAs adhering on the film is prevented from remaining when the SiON film is removed after the growth of the current blocking layer. Therefore, an imperfect growth of the contact layer which is grown on the optical waveguide after the removal of the SiON film is suppressed, and an imperfect contact of the electrode which is directly formed on the waveguide with the upper surface of the waveguide is suppressed, whereby the reduction in the light output power is prevented. In addition, since the thickness of the SiON film as the selective growth mask for the current blocking layer is thinner than 50 nm, a stress such as a shearing stress produced between the selective growth mask and the semiconductor layer constituting the upper part of the optical waveguide by a heat history during the selective growth of the current blocking layer is relaxed, and the generation of dark lines in the active layer due to these dislocations is suppressed, whereby the reduction in the light output power is prevented.

According to a fourth aspect of the present invention, in the method of fabricating the semiconductor light emitting device, the first temperature is higher than 500° C., and a selective growth mask for the current blocking layer comprises SiON having a composition ratio of oxygen lower than that of $SiO_2$ in the prior art, so an imperfect growth of the contact layer which is grown on the optical waveguide after the removal of the SiON film is suppressed, and an imperfect contact of the electrode which is directly formed on the waveguide with the upper surface of the waveguide is suppressed, whereby the reduction in the light output power is prevented. In addition, the thickness of the SiON film as the selective growth mask for the current blocking layer is thinner than 50 nm, and the film formation temperature, i.e., the first temperature, is higher than 500° C. at which rearrangement of atoms of the semiconductor layer constituting the optical waveguide occurs. Even though the temperature rises from the room temperature to the general growth temperature of 600°~700° C. during the selective growth of the current blocking layer, in the semiconductor layer constituting the upper part of the optical waveguide, the rearrangement of atoms that prevents a stress between the semiconductor layer and the selective growth mask already occurs at such a high temperature. Therefore, a stress such as a shearing stress produced between the selective growth mask and the semiconductor layer constituting the upper part of the optical waveguide in the selective growth of the current blocking layer is relaxed, and the generation of dislocations due to this stress in the semiconductor layer constituting the optical waveguide is prevented. As a result, the generation of dark lines in the active layer due to these dislocations is suppressed, whereby the reduction in the light output power is prevented.

According to a fifth aspect of the present invention, in the method of fabricating the semiconductor light emitting device, an absolute value of difference between the first temperature and the second temperature is lower than 100° C., and a selective growth mask for the current blocking layer comprises SiON having a composition ratio of oxygen lower than that of $SiO_2$ in the prior art, so an imperfect growth of the contact layer which is grown on the optical waveguide after the removal of the SiON film is suppressed, and an imperfect contact of the electrode directly formed on the waveguide with the upper surface of the waveguide is suppressed, whereby the reduction in the light output power is prevented. In addition, since the thickness of the SiON film as the selective growth mask for the current blocking layer is thinner than 50 nm, and the film formation temperature, i.e., the first temperature, and the growth temperature of the current blocking layer, i.e., the second temperature, are approximately equal to each other, in the deposition of the selective growth mask the semiconductor layer constituting the upper part of the optical waveguide is heated with a thermal process similar to the heat history in the selective growth of the current blocking layer. Therefore, a stress such as a shearing stress produced between the selective growth mask and the semiconductor layer constituting the upper part of the optical waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a sixth aspect of the present invention, a method of fabricating a semiconductor light emitting device comprises forming an SiN film having a thickness thinner than 50 nm in a striped region on a surface of a first semiconductor layer at a film formation temperature which is a first temperature, etching the first semiconductor layer to a prescribed depth using the SiN film as a mask and forming an optical waveguide comprising the first semiconductor layer which is left below the SiN film, and selectively growing a second semiconductor layer which is to be a current blocking layer on a portion of the first semiconductor layer removed by etching using the SiN film as a mask at a growth temperature which is a second temperature. Since a selective growth mask for the current blocking layer comprises SiN containing no oxygen which is different from $SiO_2$ and SiON, the adhesion of the material of the current blocking layer to the surface of the selective growth mask is suppressed, and the SiN film directly under the material of the current blocking layer adhering on the film is prevented from remaining when the SiN film is removed after the growth of the current blocking layer. Therefore, an imperfect growth of the contact layer which is grown on the optical waveguide after the removal of the SiN film is suppressed, and even when an electrode is directly formed on the waveguide, an imperfect contact of the electrode with the upper surface of the waveguide is prevented. That is, the reduction in the light output power due to the imperfect growth of the contact layer or due to the imperfect contact of the electrode with the upper surface of the waveguide is prevented. In addition, since the thickness of the SiN film as the selective growth mask for the current blocking layer is thinner than 50 nm, a stress such as a shearing stress produced between the selective growth mask and the semiconductor layer constituting the upper part of the waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a seventh aspect of the present invention, the method of fabricating the semiconductor light emitting device further includes etching away the SiN film and growing a contact layer on the entire surface of the optical waveguide and the current blocking layer after the selective growth of the current blocking layer. Since a selective growth mask for the current blocking layer comprises SiN containing no oxygen which is different from $SiO_2$ and SiON, the adhesion of the material of the current blocking layer to the surface of the SiN film is suppressed, and the SiN film directly under the material of the current blocking layer adhering on the film is prevented from remaining when the SiN film is etched away after the growth of the current blocking layer. Therefore, an imperfect growth of the contact layer which is grown on the optical waveguide after the removal of the SiN film is suppressed, and the reduction in the light output power is prevented. In addition, since the thickness of the SiN film as the selective growth mask for the current blocking layer is thinner than 50 nm, a stress such as a shearing stress produced between the selective growth mask and the semiconductor layer constituting the upper part of the optical waveguide by a heat history during the selective growth of the current blocking layer is relaxed, and the generation of dark lines in the active layer due to these dislocations is suppressed, whereby the reduction in the light output power is prevented.

According to an eighth aspect of the present invention, in the method of fabricating the semiconductor light emitting device, the current blocking layer comprises GaAs, and a selective growth mask for the current blocking layer comprises SiN containing no oxygen which is different from $SiO_2$ and SiON, so the adhesion of the GaAs as the material of the current blocking layer to the surface of the SiN film is suppressed, and the SiN film directly under the GaAs adhering on the film is prevented from remaining when the SiN film is removed after the growth of the current blocking layer. Therefore, an imperfect growth of the contact layer which is grown on the optical waveguide after the removal of the SiN film is suppressed, and an imperfect contact of the electrode which is directly formed on the waveguide with the upper surface of the waveguide is suppressed, whereby the reduction in the light output power is prevented. In addition, since the thickness of the SiN film as the selective growth mask for the current blocking layer is thinner than 50 nm, a stress such as a shearing stress produced between the selective growth mask and the semiconductor layer constituting the upper part of the optical waveguide by a heat history during the selective growth of the current blocking layer is relaxed, and the generation of dark lines in the active layer due to these dislocations is suppressed, whereby the reduction in the light output power is prevented.

According to a ninth aspect of the present invention, in the method of fabricating the semiconductor light emitting device, the first temperature is higher than 500° C., and a selective growth mask for the current blocking layer comprises SiN containing no oxygen which is different from $SiO_2$ and SiON, so an imperfect growth of the contact layer which is grown on the optical waveguide after the removal of the SiN film is suppressed, and an imperfect contact of the electrode which is directly formed on the waveguide with the upper surface of the waveguide is suppressed, whereby the reduction in the light output power is prevented. In addition, the thickness of the SiN film as the selective growth mask for the current blocking layer is thinner than 50 nm, and the film formation temperature, i.e., the first temperature, is higher than 500° C. at which rearrangement of atoms of the semiconductor layer constituting the optical waveguide occurs. Even though the temperature rises from the room temperature to the general growth temperature of 600°~700° C. during the selective growth of the current blocking layer, in the semiconductor layer constituting the upper part of the optical waveguide, the rearrangement of atoms that prevents a stress between the semiconductor layer and the selective growth mask already occurs at such a high temperature. Therefore, a stress such as a shearing stress produced between the selective growth mask and the semiconductor layer constituting the upper part of the optical waveguide in the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a tenth aspect of the present invention, in the method of fabricating the semiconductor light emitting device, an absolute value of difference between the first temperature and the second temperature is lower than 100° C., and a selective growth mask for the current blocking layer comprises SiN containing no oxygen which is different from $SiO_2$ and SiON, so an imperfect growth of the contact layer which is grown on the optical waveguide after the removal of the SiN film is suppressed, and an imperfect contact of the electrode which is directly formed on the waveguide with the upper surface of the waveguide is suppressed, whereby the reduction in the light output power is prevented. In addition, since the thickness of the SiN film as the selective growth mask for the current blocking layer is thinner than 50 nm, and the film formation temperature, i.e., the first temperature, and the growth temperature of the current blocking layer, i.e., the second temperature, are approximately equal to each other, in the deposition of the selective growth mask the semiconductor layer constituting the upper part of the optical waveguide is heated with a thermal process similar to the heat history in the selective growth of the current blocking layer. Therefore, a stress such as a shearing stress produced between the selective growth mask and the semiconductor layer constituting the upper part of the optical waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a eleventh aspect of the present invention, a semiconductor light emitting device is fabricated by a method comprising preparing a first conductivity type GaAs substrate, forming a semiconductor layer including a lower cladding layer comprising $Al_xGa_{1-x}As$ having the first conductivity type, an active layer comprising $Al_yGa_{1-y}As$ grown on the lower cladding layer in which Al composition ratio y is smaller than x of the lower cladding layer, and an upper cladding layer comprising $Al_zGa_{1-z}As$ having the second conductivity type opposite to the first conductivity type grown on the active layer in which Al composition ratio z is larger than y of the active layer, forming an SiON film having a thickness thinner than 50 nm in a striped region on a surface of the semiconductor layer, etching the semiconductor layer to leave a part of the upper cladding layer by prescribed thickness using the SiON film as a mask and forming an optical waveguide comprising the semiconductor layer which is left below the SiON film, selectively growing a current blocking layer comprising GaAs having the first conductivity type on a portion of the semiconductor layer removed by etching with a mask of the SiON film, removing the SiON film, forming a contact layer comprising GaAs having the second conductivity type on the entire exposed surface of the semiconductor layer and the current blocking layer, forming a front surface electrode on the surface of contact layer, and forming a rear surface electrode on the rear surface of the GaAs substrate. Since the selective growth mask for the current blocking layer comprises SiON having a composition ratio of oxygen lower than that of $SiO_2$ in the prior art, the adhesion of the material of the current blocking layer to the surface of the SiON film is suppressed, and the SiON film directly under the material of the current blocking layer adhering on the film is prevented from remaining when the SiON film is removed after the growth of the current blocking layer. Therefore, an imperfect growth of the contact layer which is grown on the optical waveguide after the removal of the SiON film is suppressed. That is, the reduction in the light output power due to the imperfect growth of the contact layer is prevented. In addition, since the thickness of the SiON film as the selective growth mask for the current blocking layer is thinner than 50 nm, a stress such as a shearing stress produced between the selective growth mask and the semiconductor layer constituting the upper part of the waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

According to a twelfth aspect of the present invention, a semiconductor light emitting device is fabricated a method comprising preparing a first conductivity type GaAs substrate, forming a semiconductor layer including a lower cladding layer comprising $Al_xGa_{1-x}As$ having the first conductivity type, an active layer comprising $Al_yGa_{1-y}As$ grown on the lower cladding layer in which Al composition ratio y is smaller than x of the lower cladding layer, and an upper cladding layer comprising $Al_zGa_{1-z}As$ having the second conductivity type opposite to the first conductivity type grown on the active layer in which Al composition ratio z is larger than y of the active layer, forming an SiN film having a thickness thinner than 50 nm in a striped region on a surface of the semiconductor layer, etching the semiconductor layer to leave a part of the upper cladding layer by prescribed thickness using the SiN film as a mask and forming an optical waveguide comprising the semiconductor layer which is left below the SiN film, selectively growing a current blocking layer comprising GaAs having the first conductivity type on a portion of the semiconductor layer removed by etching with a mask of the SiN film, removing the SiN film, forming a contact layer comprising GaAs having the second conductivity type on the entire exposed surface of the semiconductor layer and the current blocking layer, forming a front surface electrode on the surface of contact layer, and forming a rear surface electrode on the rear surface of the GaAs substrate. Since a selective growth mask for the current blocking layer comprises SiN containing no oxygen which is different from $SiO_2$ and SiON, the adhesion of the material of the current blocking layer to the surface of the selective growth mask is suppressed, and the SiN film directly under the material of the current blocking layer adhering on the film is prevented from remaining when the SiN film is removed after the growth of the current blocking layer. Therefore, an imperfect growth of the contact layer which is grown on the optical waveguide after the removal of the SiN film is suppressed. That is, the reduction in the light output power due to the imperfect growth of the contact layer is prevented. In addition, since the thickness of the SiN film as the selective growth mask for the current blocking layer is thinner than 50 nm, a stress such as a shearing stress produced between the selective growth mask and the semiconductor layer constituting the upper part of the waveguide by a heat history during the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

DETAILED DESCRIPTION OF THE PREFERRED EMBODIMENTS

Embodiment 1.

Figure 1:
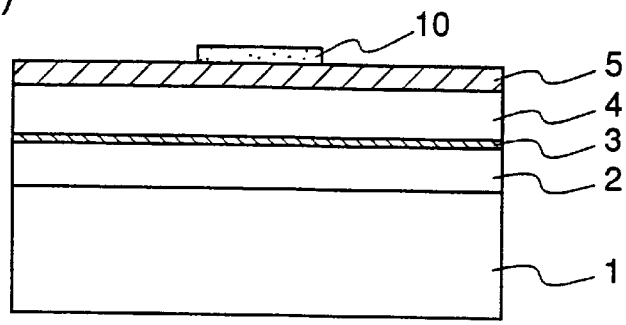
FIGS. 1(a)–1(d) are sectional views illustrating a method of fabricating a semiconductor light emitting device according to a first embodiment of the present invention.
Figure 1:
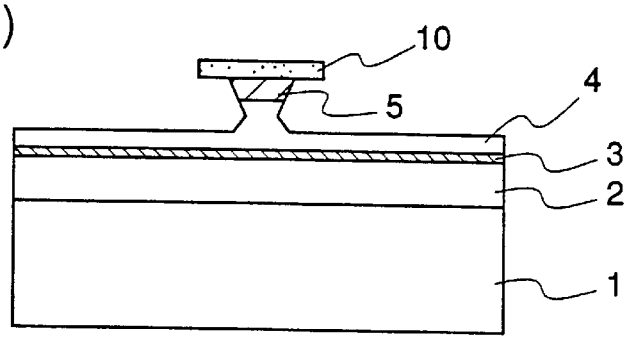
Figure 1:
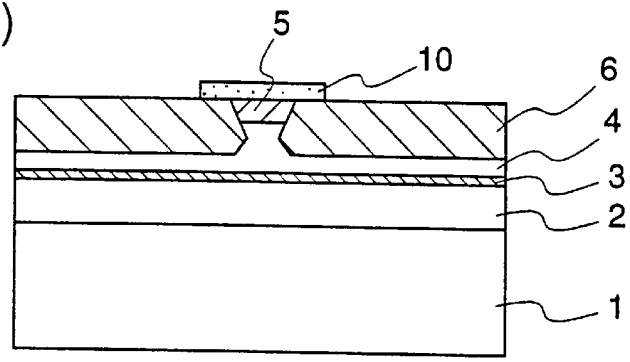
Figure 1:
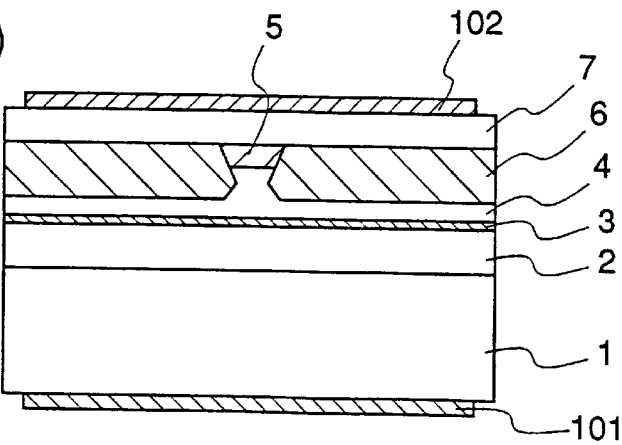

FIGS. 1(a)–1(d) are sectional views illustrating a method of fabricating a semiconductor light emitting device according to a first embodiment of the present invention. Initially, in the step of FIG. 1(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by metal organic chemical vapor deposition (hereinafter, referred to as MOCVD), an SiON film thinner than 50 nm is formed on the p type GaAs cap layer 5 by CVD and then etched away so that the SiON film is left only on a striped region of the cap layer. Next, using the remaining SiON film 10 as a mask, the p type GaAs cap layer 5 and a part of the p type AlGaAs upper cladding layer 4 is etched away employing a tartaric acid based etchant, and a portion to be an optical waveguide under the SiON film 10 is left as shown in FIG. 1(b). In the step of FIG. 1(c), n type GaAs current blocking layers 6 are selectively grown so as to bury the etched portion, employing the SiON film 10 as a mask, by MOCVD. Here, the growth temperature is 600°~700° C. In the step of FIG. 1(d), after the removal of the SiON film 10 employing a hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. When a forward bias voltage is applied between the n side and the p side electrodes of the semiconductor laser device fabricated as described above, and a current flowing into the semiconductor laser device is larger than a threshold current of the laser, laser oscillation occurs.

In the first embodiment, since a selective growth mask for the current blocking layer comprises SiON having a composition ratio of oxygen lower than that of $SiO_2$ used in the prior art, in the selective growth of the n type GaAs current blocking layer, adhesion of the GaAs to the surface of the SiON film is suppressed, and the SiON film directly under the GaAs adhering to the film is prevented from remaining when the SiON film is removed after the growth of the current blocking layer. Therefore, imperfect growth of the p type GaAs contact layer which is grown on the p type GaAs cap layer after the removal of the SiON film is suppressed, and the reduction in the light output power is prevented.

In addition, in the first embodiment, since the SiON film as the selective growth mask for the current blocking layer is thinner than 50 nm, a stress such as a shearing stress which is produced between the selective growth mask and the p type GaAs cap layer by the heat history of the selective growth of the current blocking layer is relaxed, and the generation of dislocations due to this stress in the semiconductor layer constituting the optical waveguide is prevented. Therefore, generation of dark lines in the active layer due to these dislocations is suppressed, and the reduction in the light output power is prevented.

Embodiment 2.

Figure 2:
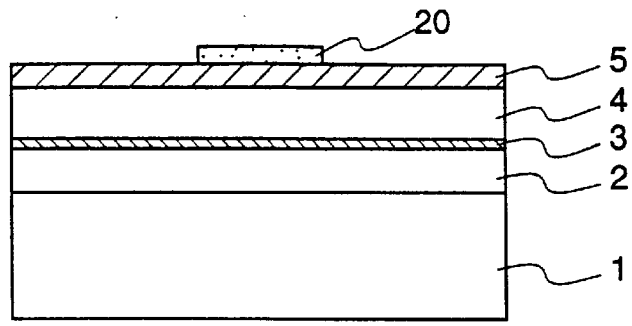
FIGS. 2(a)–2(d) are sectional views illustrating a method of fabricating a semiconductor light emitting device according to a second embodiment of the present invention.
Figure 2:
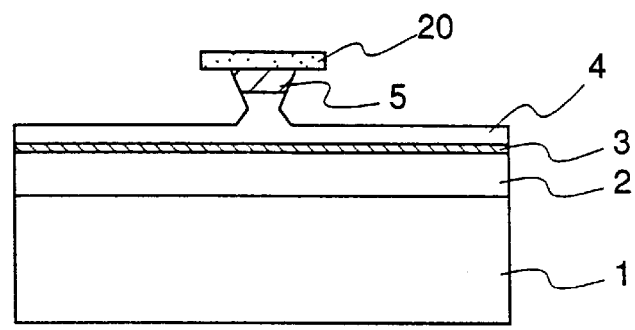
Figure 2:
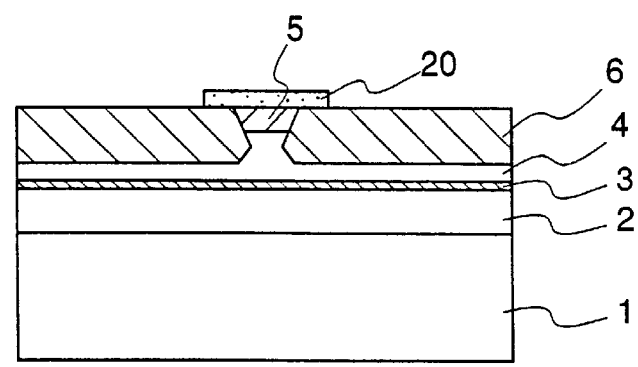
Figure 2:
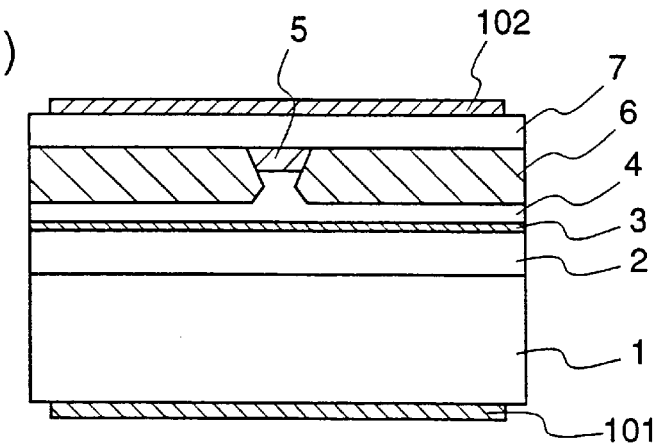

FIGS. 2(a)–2(d) are sectional views illustrating a method of fabricating a semiconductor light emitting device according to a second embodiment of the present invention. Initially, in the step of FIG. 2(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by MOCVD, an SiON film thinner than 50 nm is formed on the p type GaAs cap layer 5 at a film formation temperature higher than 500° C. by CVD and then etched away so that the SiON film is left only on a striped region of the cap layer. Next, using the remaining SiON film 20 as a mask, the p type GaAs cap layer 5 and a part of the p type AlGaAs upper cladding layer 4 is etched away employing a tartaric acid based etchant, and a portion to be an optical waveguide under the SiON film 20 is left as shown in FIG. 2(b). In the step of FIG. 2(c), n type GaAs current blocking layers 6 are selectively grown so as to bury the etched portion, employing the SiON film 20 as a mask, by MOCVD. Here, the growth temperature is 600°~700° C. In the step of FIG. 2(d), after the removal of the SiON film 20 employing a hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. The second embodiment, is different from the first embodiment in that the temperature of forming the SiON film as the selective growth mask for the current blocking layer is higher than 500° C.

In the second embodiment, since a selective growth mask for the current blocking layer comprises SiON having a composition ratio of oxygen lower than that of $SiO_2$ used in the prior art, as in the first embodiment, imperfect growth of the p type GaAs contact layer which is grown on the optical waveguide after the removal of the SiON film is suppressed, and reduction in the light output power is prevented.

In addition, in the second embodiment, the SiON film as the selective growth mask for the current blocking layer is thinner than 50 nm, and the film formation temperature is higher than 500° C. at which rearrangement of atoms of the semiconductor layer constituting the optical waveguide occurs. Even though the temperature rises from the room temperature to the growth temperature of 600°~700° C. during the selective growth of the current blocking layer, the rearrangement of atoms that prevents a stress between the p type GaAs cap layer and the selective growth mask has already occurred at such a high temperature. Therefore, a stress such as a shearing stress produced between the selective growth mask and the p type GaAs cap layer during the selective growth of the current blocking layer is relaxed, and the generation of dislocations due to this stress in the semiconductor layer constituting the optical waveguide is prevented. As a result, the generation of dark lines in the active layer due to these dislocations is suppressed, and reduction in the light output power is prevented.

Embodiment 3.

Figure 3:
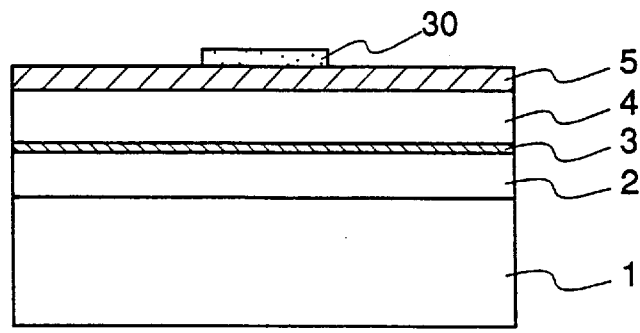
FIGS. 3(a)–3(d) are sectional views illustrating a method of fabricating a semiconductor light emitting device according to a third embodiment of the present invention.
Figure 3:
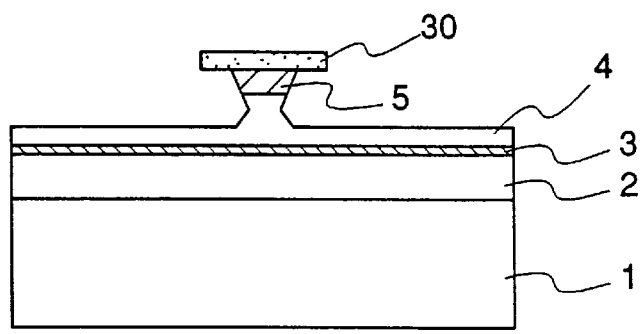
Figure 3:
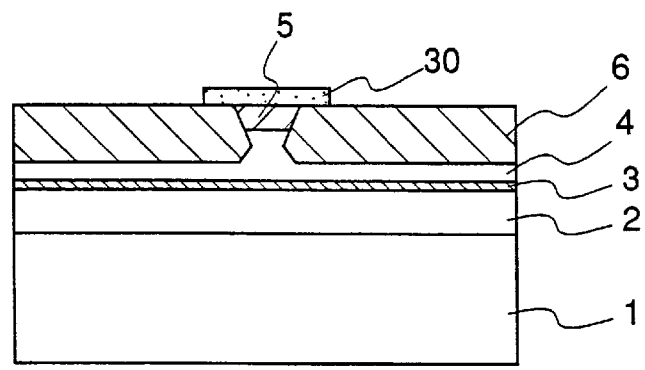
Figure 3:
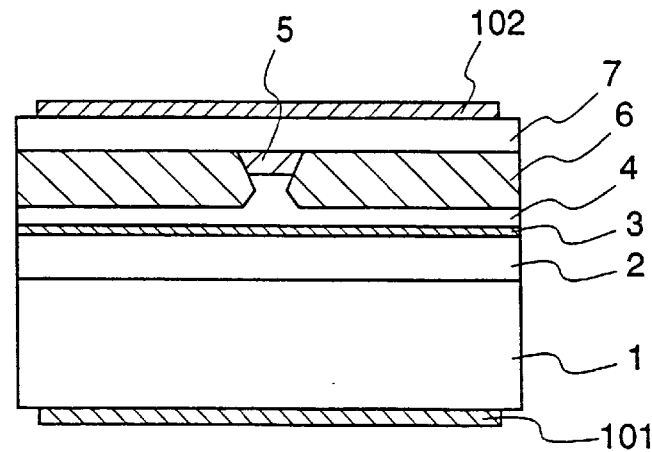

FIGS. 3(a)–3(d) are sectional views illustrating a method of fabricating a semiconductor light emitting device according to a third embodiment of the present invention. Initially, in the step of FIG. 3(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by MOCVD, an SiON film thinner than 50 nm is formed on the p type GaAs cap layer 5 by CVD. Here, the film formation temperature for the SiON film is in a range of the growth temperature of the current blocking layer±100° C. Further, the SiON film is etched away so that the SiON film is left only on a striped region of the cap layer. Next, using the remaining SiON film 30 as a mask, the p type GaAs cap layer 5 and a part of the p type AlGaAs upper cladding layer 4 is etched away employing a tartaric acid based etchant, and a portion to be an optical waveguide under the SiON film 30 is left as shown in FIG. 3(b). In the step of FIG. 3(c), n type GaAs current blocking layers 6 are selectively grown so as to bury the etched portion, employing the SiON film 30 as a mask, by MOCVD. Here, the growth temperature is 600°~700° C. In the step of FIG. 3(d), after the removal of the SiON film 30 employing the hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. The third embodiment, is different from the first embodiment that the temperature in forming the SiON film as the selective growth mask for the current blocking layer is in a range of the growth temperature of the current blocking layer ±100° C.

In the third embodiment, since a selective growth mask for the current blocking layer comprises SiON having a composition ratio of oxygen lower than that of $SiO_2$ used in the prior art, as in the first embodiment, imperfect growth of the p type GaAs contact layer which is grown on the p type GaAs cap layer after the removal of the SiON film is suppressed, and reduction in the light output power is prevented.

In addition, in the third embodiment, since the SiON film as the selective growth mask for the current blocking layer is thinner than 50 nm, and the difference between the film formation temperature and the growth temperature of the current blocking layer is lower than 100° C., in the deposition of the selective growth mask the p type GaAs cap layer is heated in a thermal process with a heat history similar to the selective growth of the current blocking layer. Therefore, a stress such as a shearing stress produced between the selective growth mask and the p type GaAs cap layer by the heat history of the selective growth of the current blocking layer is relaxed, and the generation of dislocations due to this stress in the semiconductor layer constituting the optical waveguide is prevented. As a result, the generation of dark lines in the active layer due to these dislocations is suppressed, and the reduction in the light output power is prevented.

Embodiment 4.

Figure 4:
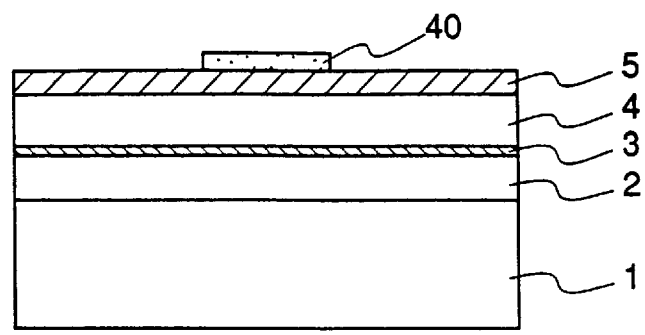
FIGS. 4(a)–4(d) are sectional views illustrating a method of fabricating a semiconductor light emitting device according to a fourth embodiment of the present invention.
Figure 4:
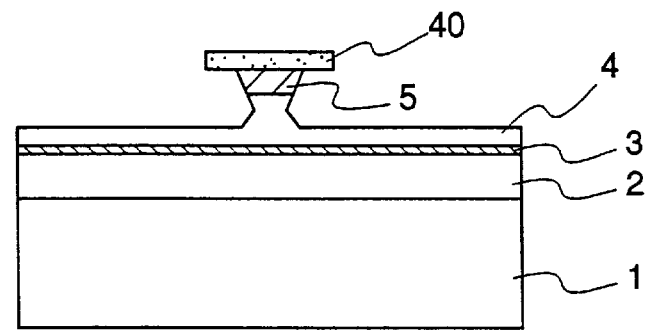
Figure 4:
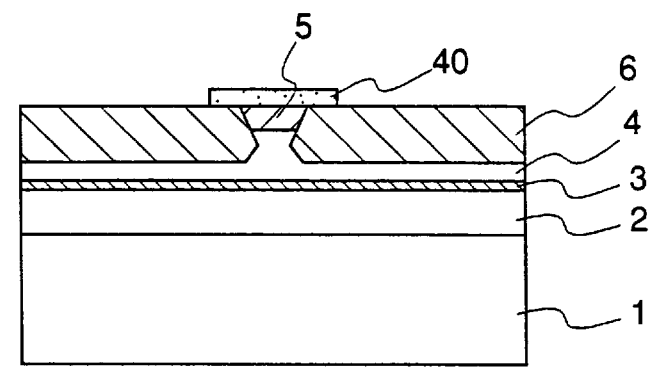
Figure 4:
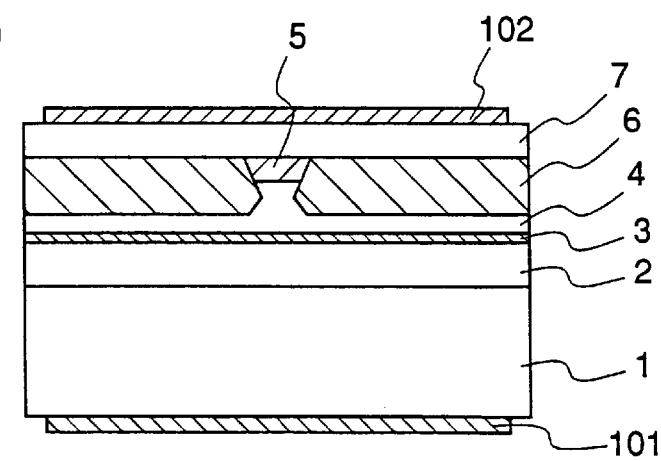

FIGS. 4(a)–4(d) are sectional views illustrating a method of fabricating a semiconductor light emitting device according to a fourth embodiment of the present invention. Initially, in the step of FIG. 4(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by MOCVD, an SiN film thinner than 50 nm is formed on the p type GaAs cap layer 5 by CVD and then etched away so that the SiN film is left only on a striped region of the cap layer. Next, using the remaining SiN film 40 as a mask, the p type GaAs cap layer 5 and a part of the p type AlGaAs upper cladding layer 4 is etched away employing a tartaric acid based etchant, and a portion to be an optical waveguide under the SiN film 40 is left as shown in FIG. 4(b). In the step of FIG. 4(c), n type GaAs current blocking layers 6 are selectively grown so as to bury the etched portion, employing the SiN film 40 as a mask, by MOCVD. Here, the growth temperature is 600°~700° C. In the step of FIG. 4(d), after the removal of the SiN film 40 employing a hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively.

In the fourth embodiment, since a selective growth mask for the current blocking layer comprises SiN containing no oxygen which is different from $SiO_2$ used in the prior art and SiON used in the first to third embodiments, in the selective growth of the n type GaAs current blocking layer, the adhesion of the GaAs to the surface of the SiN film is further suppressed as compared with the case of using the $SiO_2$ film and the SiON film, and the SiN film directly under the GaAs adhering on the film is prevented from remaining when the SiN film is removed after the growth of the current blocking layer. Therefore, imperfect growth of the p type GaAs contact layer which is grown on the p type GaAs cap layer after the removal of the SiN film is suppressed, and reduction in the light output power is prevented.

In addition, in the fourth embodiment, since the SiN film as the selective growth mask for the current blocking layer is thinner than 50 nm, a stress such as a shearing stress produced between the selective growth mask and the p type GaAs cap layer by the heat history of the selective growth of the current blocking layer is relaxed, and the generation of dislocations due to this stress in the semiconductor layer constituting the optical waveguide is prevented. Therefore, the generation of dark lines in the active layer due to these dislocations is suppressed, and reduction in the light output power is prevented.

Embodiment 5.

Figure 5:
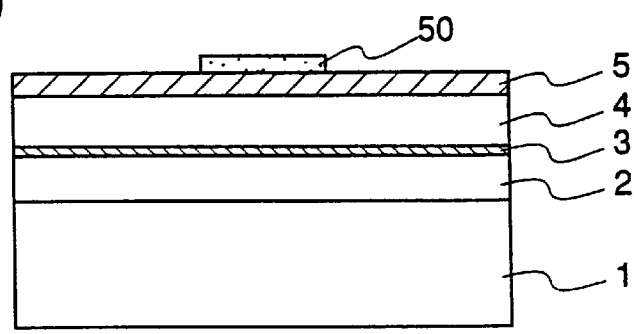
FIGS. 5(a)–5(d) are sectional views illustrating a method of fabricating a semiconductor light emitting device according to a fifth embodiment of the present invention.
Figure 5:
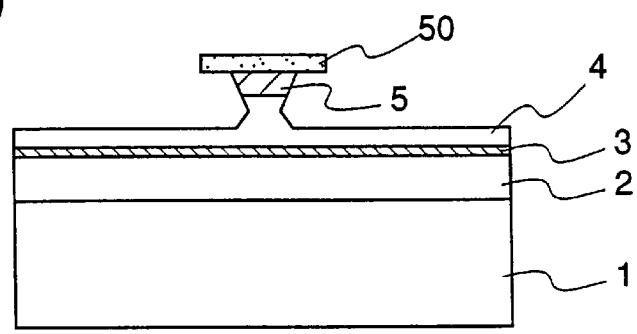
Figure 5:
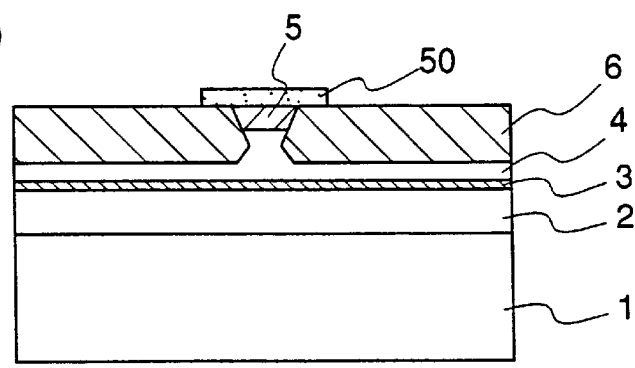
Figure 5:
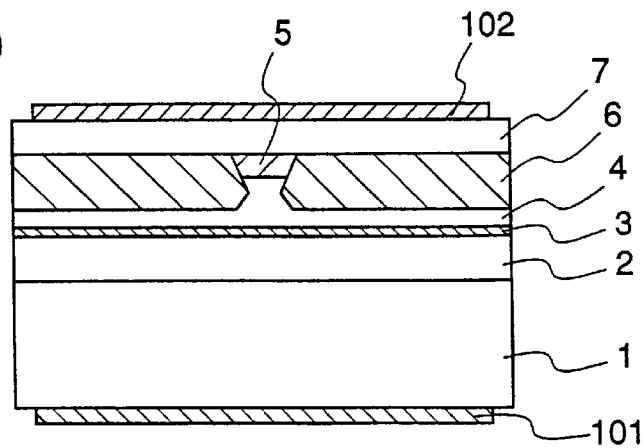

FIGS. 5(a)–5(d) are sectional views illustrating a method of fabricating a semiconductor light emitting device according to a fifth embodiment of the present invention. Initially, in the step of FIG. 5(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by MOCVD, an SiN film thinner than 50 nm is formed on the p type GaAs cap layer 5 at a film formation temperature higher than 500° C. by CVD and then etched away so that the SiN film is left only on a striped region of the cap layer. Next, using the remaining SiN film 50 as a mask, the p type GaAs cap layer 5 and a part of the p type AlGaAs upper cladding layer 4 is etched away employing a tartaric acid based etchant, and a portion to be an optical waveguide under the SiN film 50 is left as shown in FIG. 5(b). In the step of FIG. 5(c), n type GaAs current blocking layers 6 are selectively grown so as to bury the etched portion, employing the SiN film 50 as a mask, by MOCVD. Here, the growth temperature is 600°~700° C. In the step of FIG. 5(d), after the removal of the SiN film 50 employing a hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. The fifth embodiment, is different from the fourth embodiment in that the temperature in forming the SiN film as the selective growth mask for the current blocking layer is higher than 500° C.

In the fifth embodiment, since a selective growth mask for the current blocking layer comprises SiN containing no oxygen, which is different from $SiO_2$ used in the prior art and SiON used in the first to third embodiments, as in the fourth embodiment, an imperfect growth of the p type GaAs contact layer which is grown on the optical waveguide after the removal of the SiN film is suppressed, and reduction in the light output power is prevented.

In addition, in the fifth embodiment, the SiN film as the selective growth mask for the current blocking layer is thinner than 50 nm, and the film formation temperature is higher than 500° C. at which rearrangement of atoms of the semiconductor layer constituting the optical waveguide occurs. Even though the temperature rises from room temperature to the growth temperature of 600°~700° C. during the selective growth of the current blocking layer, in the p type GaAs cap layer the rearrangement of atoms that prevents a stress between the cap layer and the selective growth mask has already occurred at such a high temperature. Therefore, a stress such as a shearing stress produced between the selective growth mask and the p type GaAs cap layer during the selective growth of the current blocking layer is relaxed, and the generation of dislocations due to this stress in the semiconductor layer constituting the optical waveguide is prevented. As a result, the generation of dark lines in the active layer due to these dislocation is suppressed, and reduction in the light output power is prevented.

Embodiment 6.

Figure 6:
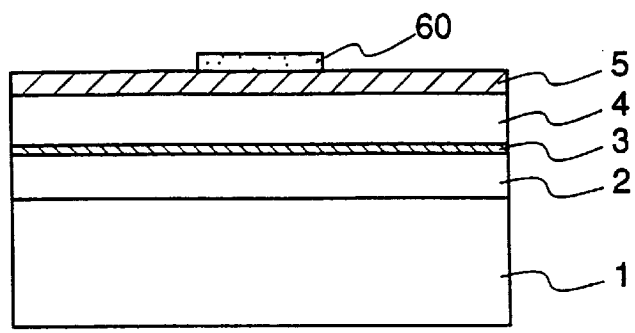
FIGS. 6(a)–6(d) are sectional views illustrating a method of fabricating a semiconductor light emitting device according to a sixth embodiment of the present invention.
Figure 6:
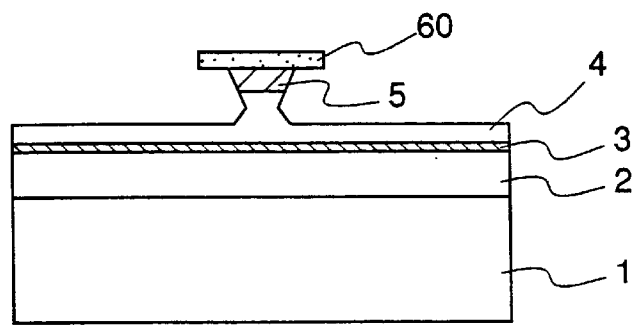
Figure 6:
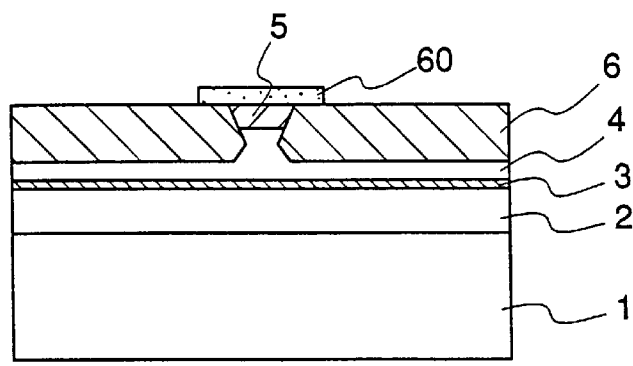
Figure 6:
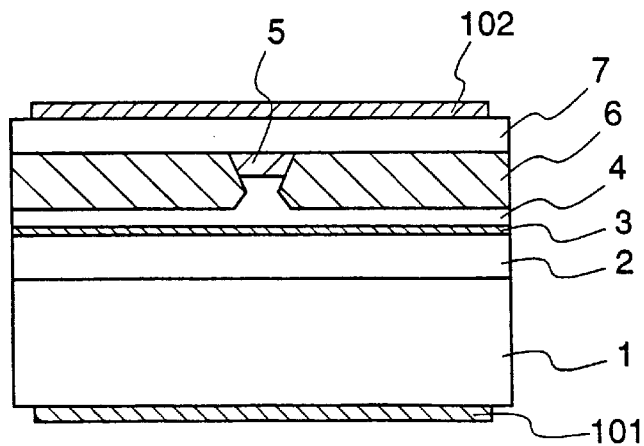
Figure 7:
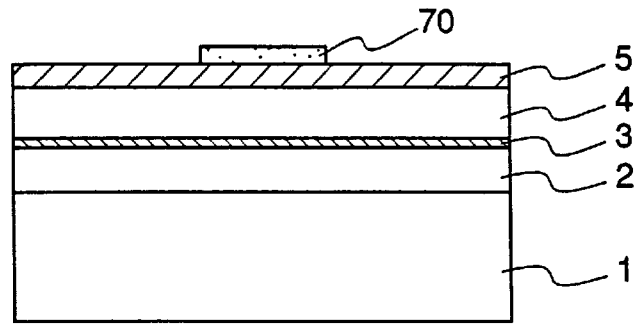
FIGS. 7(a)–7(d) are sectional views illustrating a method of fabricating a semiconductor light emitting device according to a prior art.
Figure 7:
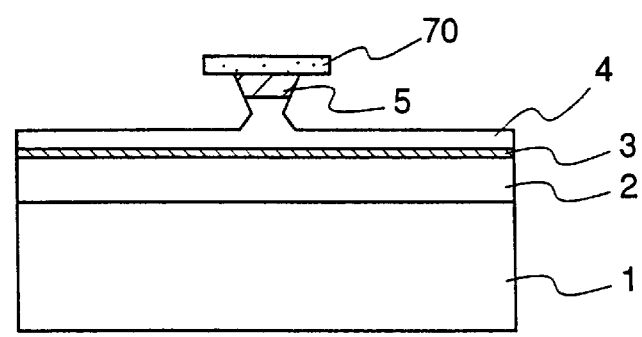
Figure 7:
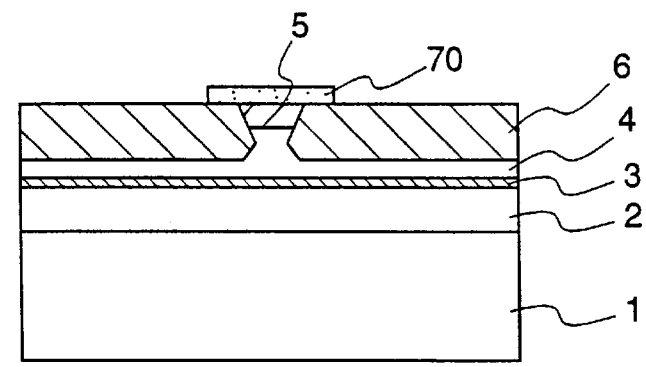
Figure 7:
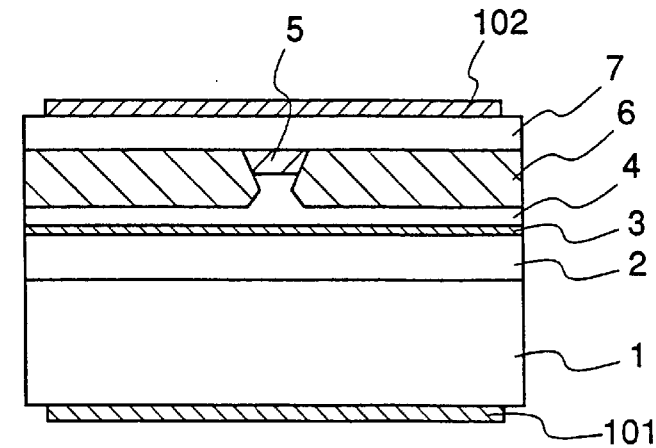

FIGS. 6(a)–6(d) are sectional views illustrating a method of fabricating a semiconductor light emitting device according to a sixth embodiment of the present invention. Initially, in the step of FIG. 6(a), after an n type $Al_{0.4}Ga_{0.6}As$ lower cladding layer 2, an $Al_{0.1}Ga_{0.9}As$ active layer 3, and a p type $Al_{0.4}Ga_{0.6}As$ upper cladding layer 4, and a p type GaAs cap layer 5 are successively epitaxially grown on the front surface of an n type GaAs substrate 1 at a growth temperature of 700° C. by MOCVD, an SiN film thinner than 50 nm is formed on the p type GaAs cap layer 5 by CVD. Here, the film formation temperature is in a range of the growth temperature of the current blocking layer±100° C. Then, the SiN film is etched away so that the SiN film is left only on a striped region of the cap layer. Next, using the remaining SiN film 60 as a mask, the p type GaAs cap layer 5 and a part of the p type AlGaAs upper cladding layer 4 is etched away employing a tartaric acid based etchant, and a portion to be an optical waveguide under the SiN film 60 is left as shown in FIG. 6(b). In the step of FIG. 6(c), n type GaAs current blocking layers 6 are selectively grown so as to bury the etched portion, employing the SiN film 60 as a mask, by MOCVD. Here, the growth temperature is 600°~700° C. In the step of FIG. 6(d), after the removal of the SiN film 60 employing a hydrofluoric acid based etchant, a p type GaAs contact layer 7 is grown on the entire surface of the cap layer 5 and the current blocking layers 6. Further, an n side electrode (a rear surface electrode) 101 is formed on the rear surface of the n type GaAs substrate 1 and a p side electrode (a front surface electrode) 102 is formed on the surface of the p type GaAs contact layer 7, respectively. The sixth embodiment is different from the fourth embodiment in that the temperature of forming the SiN film as the selective growth mask for the current blocking layer is in a range of the growth temperature of the current blocking layer±100° C.

In the sixth embodiment, since a selective growth mask for the current blocking layer comprises SiN containing no oxygen which is different from $SiO_2$ used in the prior art and SiON used in the first to third embodiments, as in the fourth embodiment, imperfect growth of the p type GaAs contact layer which is grown on the p type GaAs cap layer after the removal of the SiN film is suppressed, and reduction in the light output power is prevented.

In addition, in the sixth embodiment, since the SiN film as the selective growth mask for the current blocking layer is thinner than 50 nm, and the difference between the film formation temperature and the growth temperature of the current blocking layer is lower than 100° C., in the deposition of the selective growth mask the p type GaAs cap layer is heated with a thermal process similar to the heat history in the selective growth of the current blocking layer. Therefore, a stress such as a shearing stress produced between the selective growth mask and the p type GaAs cap layer during the selective growth of the current blocking layer is relaxed, and the generation of dislocations due to this stress in the semiconductor layer constituting the optical waveguide is prevented. As a result, the generation of dark lines in the active layer due to these dislocations is suppressed, and reduction in the light output power is prevented.

What is claimed is:

1. A semiconductor light emitting device fabricated by a method comprising:

preparing a first conductivity type GaAs substrate;

forming a semiconductor layer including a lower cladding layer comprising $Al_xGa_{1-x}As$ having the first conductivity type, an active layer comprising $Al_yGa_{1-y}As$ grown on the lower cladding layer in which Al composition ratio y is smaller than x of the lower cladding layer, and an upper cladding layer comprising $Al_zGa_{1-z}As$ having the second conductivity type opposite to the first conductivity type grown on the active layer in which Al composition ratio z is larger than y of the active layer;

forming an SiON film having a thickness thinner than 50 nm in a striped region on a surface of the semiconductor layer;

etching the semiconductor layer to leave a part of the upper cladding layer by prescribed thickness using the SiON film as a mask and forming an optical waveguide comprising the semiconductor layer which is left below the SiON film;

selectively growing a current blocking layer comprising GaAs having the first conductivity type on a portion of the semiconductor layer removed by etching, using the SiON film as a mask;

removing the SiON film, and forming a contact layer comprising GaAs having the second conductivity type on the entire exposed surface of the semiconductor layer and the current blocking layer;

forming a front surface electrode on the surface of contact layer, and forming a rear surface electrode on the rear surface of the GaAs substrate.

2. A semiconductor light emitting device fabricated by a method comprising:

preparing a first conductivity type GaAs substrate;

forming a semiconductor layer including a lower cladding layer comprising $Al_xGa_{1-x}As$ having the first conductivity type, an active layer comprising $Al_yGa_{1-y}As$ grown on the lower cladding layer in which Al composition ratio y is smaller than x of the lower cladding layer, and an upper cladding layer comprising $Al_zGa_{1-z}As$ having the second conductivity type opposite to the first conductivity type grown on the active layer in which Al composition ratio z is larger than y of the active layer;

forming an SiN film having a thickness thinner than 50 nm in a striped region on a surface of the semiconductor layer;

etching the semiconductor layer to leave a part of the upper cladding layer by prescribed thickness using the SiN film as a mask and forming an optical waveguide comprising the semiconductor layer which is left below the SiN film;

selectively growing a current blocking layer comprising GaAs having the first conductivity type on a portion of the semiconductor layer removed by etching, using the SiN film as a mask;

removing the SiN film, and forming a contact layer comprising GaAs having the second conductivity type on the entire exposed surface of the semiconductor layer and the current blocking layer;

forming a front surface electrode on the surface of contact layer, and forming a rear surface electrode on the rear surface of the GaAs substrate.

* * * * *